United States Patent [19]

Schroder

[11] 4,181,896
[45] Jan. 1, 1980

[54] DEVICE FOR OPTIONAL DYNAMIC COMPRESSION OR EXPANSION

[75] Inventor: Ernst Schroder, Hanover, Fed. Rep. of Germany

[73] Assignee: Licentia Patent-Verwaltungs-G.m.b.H, Frankfurt, Fed. Rep. of Germany

[21] Appl. No.: 923,194

[22] Filed: Jul. 10, 1978

[30] Foreign Application Priority Data

Aug. 6, 1977 [DE] Fed. Rep. of Germany ....... 2735500

[51] Int. Cl.² .................. H03G 3/20; H03G 7/08
[52] U.S. Cl. ........................ 330/282; 330/86; 330/145; 330/284; 333/14
[58] Field of Search ............ 330/144, 145, 86, 282, 330/284; 333/14

[56] References Cited

U.S. PATENT DOCUMENTS 3,969,680   7/1976   Wermuth ........................ 330/282

FOREIGN PATENT DOCUMENTS 2403756   8/1975   Fed. Rep. of Germany ........... 330/282

OTHER PUBLICATIONS

Sherwin, "A Linear Multiple Gain-Controlled Amplifier," *New Electronics*, Dec. 9, 1975, pp. 26–28.

*Primary Examiner*—James B. Mullins
*Attorney, Agent, or Firm*—Spencer & Kaye

[57] ABSTRACT

A circuit for optional dynamic compression or expansion, with one amplifier located in the useful signal path and controllable in amplification, and an auxiliary branch including one amplifier controllable in amplification and a control voltage generator, to the input of which a useful signal path is connected and the output voltage of which serves to control the controllable amplification in the useful signal path and in the auxiliary branch, and wherein as adjusting members for controlling the amplification of the controllable amplifiers there serve field effect transistors to the control electrodes of which respective direct control voltages are applied. In parallel with the source-sink path of one field effect transistor serving as adjusting member for an amplifier located in the useful signal path there is connected a voltage divider the tapping of which is connected via a separating amplifier to the control electrode of the field effect transistor. The output of the separating amplifier is additionally connected to the control electrode of a field effect transistor serving as adjusting member for an amplifier located in the auxiliary branch.

5 Claims, 1 Drawing Figure

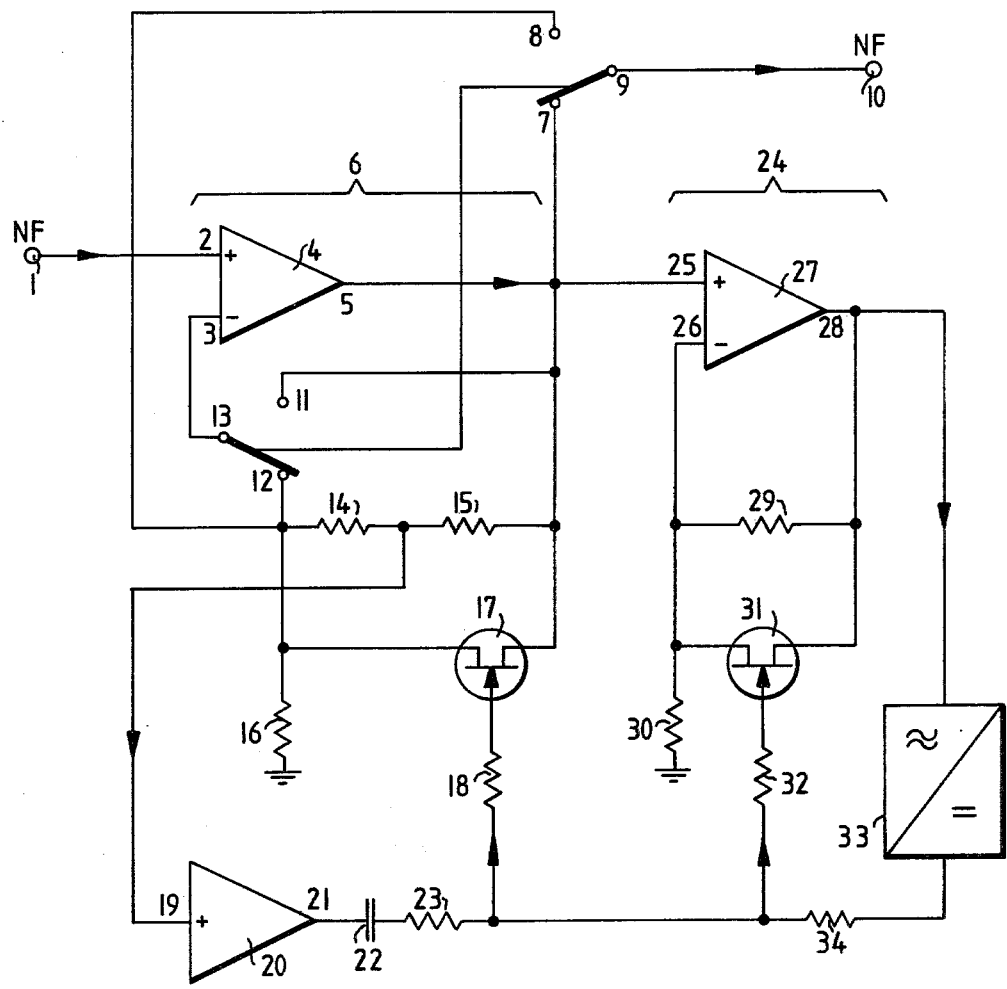

DEVICE FOR OPTIONAL DYNAMIC COMPRESSION OR EXPANSION

BACKGROUND OF THE INVENTION

From U.S. Pat. No. 3,969,680, a compander system is known in which for optional dynamic compression or expansion there are provided at least one amplifier of controllable amplification located in the useful signal path, and an auxiliary branch including at least one amplifier of controllable amplification as well as a control voltage generator, the input of the auxiliary branch being connected to the useful signal path and the output voltage of the control voltage generator serving to control the controllable amplification in the useful signal path and in the auxiliary branch.

As adjusting members for the amplifiers of controllable amplification there are advantageously used field effect transistors, which have a comparatively linear control characteristic and hence effect only a slight distortion of the alternating voltage signal to be influenced in amplitude. In order to attain these advantages in the case of a field effect transistor operated as an adjusting member (controllable resistor) one can, in accordance with German Offenlegungsschrift No. 21 61 905, apply to the control electrode of the related field effect transistor, in addition to the direct control voltage, half of the alternating voltage between the source and sink. For decoupling the said two voltages (direct control voltage and alternating voltage) a separating condenser is used.

Additionally to the said advantageous property of a field effect transistor it is required that a field effect transistor used as a controllable resistance should have a short time constant as regards its controlling action. In this manner a relatively rapid alteration of the resistance of the field effect transistor is to be made possible. This requirement cannot at once be met when using the said separating condenser. It has therefore been proposed (German Offenlegungsschrift No. 24 03 756) to use a separating amplifier instead of the separating condenser.

SUMMARY OF THE INVENTION

The invention is based on the problem of providing a compander system of the type described initially in which field effect transistors are used as adjusting members and which makes possible a rapid control of the value of the resistance of the field effect transistor with only slight expenditure and with the retention of the said advantages of field effect transistors.

According to the invention, in parallel with the source-sink path of one field effect transistor serving as adjusting member for an amplifier located in the useful signal path there is connected a voltage divider the tapping of which is connected via a separating amplifier to the control electrode of the field effect transistor. The output of the separating amplifier is additionally connected to the control electrode of a field effect transistor serving as adjusting member for an amplifier located in the auxiliary branch.

The invention is based inter alia on appreciation of the fact that in the compander system described advantageous control of a field effect transistor operating as an adjusting member in the branch path is also possible if the alternating voltage applied to its control electrode additionally to the direct control voltage is derived not from its source-sink path but from the source-sink path of a field effect transistor operating as an adjusting member in the useful signal path. This is based essentially on the fact that in those cases of operation which for the reasons given an alternating voltage must also be applied to the control electrode of the controlled field effect transistor (high input voltage of the compander and amplifications of the adjusting amplifiers close to the value 1) the alternating voltage or its half derived from the field effect transistor operating suitably in the useful signal path is of the order of magnitude of the alternating voltage necessary for the field effect transistor suitably operating in the branch path.

The invention has the advantage that for a field effect transistor suitably operating in the branch path no separate separating amplifier is necessary for separating the two voltages (direct control voltage and alternating voltage) applied to its control electrode.

BRIEF DESCRIPTION OF THE DRAWINGS

The invention will be explained in more detail with reference to a practical example which is illustrated in the drawing.

The drawing shows a compander which can be used for optional compression or expansion, the design of which corresponds in principle to the compander system known from U.S. Pat. No. 3,969,680.

DESCRIPTION OF THE PREFERRED EMBODIMENTS

The circuit illustrated includes a first controllable amplifier 6 located between the input terminal I and the output terminal 10 and hence in the useful signal path of the useful LF voltage which is to be varied in dynamic range, and a second controllable amplifier 24 which is located in an auxiliary branch path connected to the useful signal path. In this auxiliary branch path there is further located a control voltage generator 33 which is connected to the output of the second controllable amplifier 24.

The control voltage generator 33 generates at its output a direct control voltage which upon a predetermined threshold value being exceeded by the alternating voltage on its input rises relatively rapidly to a high value. The control characteristic of this control voltage generator is advantageously a curve that rises exponentially. A practical example of the said control voltage generator is described in more detail in the U.S. Pat. No. 3,969,680.

The direct control voltage generated by the control voltage generator 33 serves to control the amplification of the two amplifiers 6 and 24. In the case of compression the control characteristics (dependence of the amplification on the applied direct control voltage) of the amplifiers have the same sign. In the case of expansion the said control characteristics of the amplifiers 6 and 24 are of opposite sign.

The circuit arrangement so far described in principle operates so that the alternating voltage at the input of the control voltage generator 33 is of constant value. Upon even a slight deviation of the voltage at the input of the control voltage generator 33 from the constant value inherent in the system the direct control voltage generated by the control voltage generator 33 controls or regulates the amplification of the amplifers 6 and 24 in such manner that the original (constant) value of the voltage at the input of the control voltage generator 33 is again attained.

In compression, this has the effect that the full dynamic range of the useful LF signal voltage on the input terminal I is reduced practically to the value O on the path from the input terminal I to the input of the control voltage generator 33. For the case in which the amplifiers 6 and 24 are of the same design the useful signal that can be taken off at the output of the amplifier 6 has only half the dynamic range of the useful signal at the input terminal I, and it is thereby compressed.

Whilst in the case of the above-described compression the amplifiers 6 and 24 are connected in series for the generation of the direct control voltage, the input of the amplifier 24 being connected to the output of the amplifier 6, in the case of expansion the input of the amplifier 24 is, like the input of the amplifier 6, connected directly to the input terminal I by reason of the features to be further described below. Since in this case however—as assumed above—the amplifications of the two amplifiers 6 and 24 are controlled in opposite senses by the direct control voltage generated by the control voltage generator 33, there now corresponds to the reduction of the (compressed) useful signal dynamic range from the input terminal I to the input of the control voltage generator 33 an increase of the dynamic range in the oppositely controlled amplifier 6, at the output of which a useful signal of the full original dynamic range can thus be taken off again.

The above-mentioned amplifier 6 includes a differential amplifier 4, to the non-inverting input 2 of which is applied the useful LF signal on the input terminal I, and the inverting input 3 of which can be connected by means of a switch 13 on the one hand to the output 5 of the differential amplifier 4 with negative feedback via a parallel circuit consisting of a field effect transistor 17 and two resistors 14 and 15 connected in series in the case of compression (contact 12) and directly to the output 5 in the case of expansion (contact 11). The switch contact 12 is connected to ground via a resistor 16.

The field effect transistor 17 is operated as a controllable resistor, so that during compression (switch 13 and contact 12 connected) there can be taken off at the output 5 of the differential amplifier 4 and hence at the output of the controllable amplifier 6 a useful signal which is controlled in amplitude and is dependent on the direct control voltage applied to the field effect transistor 17. This depends inter alia on the controlled field effect transistor being part of a voltage divider located in the negative feed-back path of the differential amplifier 4.

In the case of expansion (switch 13 connected to contact 11) the differential amplifier 4 has the amplifying value "I". Hence the useful signal that can be taken from the output 5 of the differential amplifier 4 is equal to the useful signal on the input terminal I. This means that in this case the input of the controllable amplifier 24 connected to the output 5 of the differential amplifier 4 is effectively connected directly to the input terminal I.

At the same time the parallel circuit formed by the field effect transistor 17 on the one hand and the resistors 14 and 15 on the other hand, together with the resistor 16, acts as a controllable voltage divider at the tapping of which (junction of the resistors 14 and 16) a controllable useful signal can be taken off.

The voltage divider described operates so that the amplitude of the useful signal taken off at the junction of the resistors 14 and 16 is dependent on the direct control voltage applied to the field effect transistor 17, which voltage is of opposite sense to that of the useful signal that in the case of compression can be taken off at the output 5 of the differential amplifier 4. Hence the amplifier 6 has oppositely directed characteristics in compression and in expansion, if during compression the output signal of the amplifier 6 is taken off at the output 5 of the differential amplifier 4 and during expansion is taken off at the junction of the resistors 14 and 16. This is achieved by the output terminal 10 of the compander illustrated being connected via a switch 9 (contact 7) to the output 5 of the differential amplifier 4 during compression and being connected via the switch 9 (contact 8) to the junction of the resistors 14 and 16 during expansion.

The above-mentioned controllable amplifier 24 includes a differential amplifier 27, to the non-inverting input 25 of which the input signal is fed and the inverting input 26 of which is connected on the one hand via the parallel circuit formed by a resistor 29 and a field effect transistor 31 to the output 28 and on the other hand to ground via a resistor 30. By means of the direct control voltage generated by the control voltage generator 33 and applied to the control electrode of the field effect transistor 31 the amplification of the differential amplifier 27 or of the amplifier 24 is controllable in the same manner as the amplification of the amplifier 6 during compression.

In order to be able to use the said field effect transistors 17 and 31 for controlling the amplification of the amplifiers 6 and 24 in optimum manner it is advantageous in certain cases of operation to apply to the control electrodes of the said field effect transistors not only the direct control voltage generated by means of the control voltage generator 33 but additionally an alternating voltage which corresponds to about half the alternating voltage across the source-sink path. The said manner of operation for which this step is particularly advantageous occurs when the source-sink path of the said field effect transistors has a relatively low value of resistance. In these cases, with the compander described the alternating voltages across the source-sink paths of the field effect transistors are of comparable magnitude. Based on appreciation of this, in accordance with an essential feature of the invention the same or about the same alternating voltage is therefore applied to the control electrodes of the two field effect transistors 17 and 31, the alternating voltage being derived from the alternating voltage across the source-sink path of the one field effect transistor 17.

For this purpose the junction of the resistors 14 and 15 is connected to the input 19 of a separating amplifier 20 the output 21 of which is connected via a condenser 22 and a resistor 23 as well as the resistors 18 and 32 to the control electrodes of the field effect transistors 17 and 31. The amplification of the separating amplifer 20 is such that taking into account the division ratio of the resistors 14 and 15 and the reduction of the corresponding alternating voltage taking place from the output 21 of the separating amplifier 20 to the control electrode of the field effect transistor 17 an alternating voltage which is equal or about equal to half the value of the alternating voltage across the source-sink path of the field effect transistor 17 is on the control electrode of the field effect transistor 17. If the resistors 14 and 15 are or equal size and the alternating voltage signal appearing at the output 21 of the separating amplifier 20 also appears without substantial reduction at the control electrode of the field effect transistor 17 the separating amplifier 20 has an amplification of I or approximately I.

The output 21 of the separating amplifier 20 feeds not only the control electrode of the field effect transistor 17 but also the control electrode of the field effect transistor 31. In accordance with the above discussion the value of the alternating voltage applied to the control electrode of the field effect transistor 31 is so high that in those cases of operation in which the application of such an alternating voltage is advantageous it has a suitable value.

In order that the adjustment members including the field effect transistors 17 and 31 may be of the same or about the same construction, there is located in parallel with the field effect transistor 31 a resistor 29 the resistance value of which is equal or about equal to the sum of the resistance values of the resistors 14 and 15. Correspondingly, the resistance value of the resistor 30 is equal or about equal to the resistance value of the resistor 16.

Since the control electrodes of the field effect transistors 17 and 31 are not only connected in the manner described to the output 21 of the separating amplifier 20 but are at the same time connected to the output of the control voltage generator 33, decoupling resistors 34 and 23 are provided for decoupling the outputs of the control voltage generator 33 and of the separating amplifier 20. The resistors 18 and 32 in the control leads for the control electrodes of the field effect transistors 17 and 31 serve to protect the control electrodes of the said field effect transistors.

In order to prevent the direct control voltage that can be taken off at the output of the control voltage generator 33 from being loaded by the output resistance of the separating amplifier 20, the separating condenser 22 is provided. In order to prevent this condenser 22 from having an appreciable influence on the time constants occurring upon a change of resistance of the field effect transistors 17 and 31, the resistance value of the resistor 23 is chosen to be relatively high. The condenser 22 may even be omitted if the output voltage of the control voltage generator 33 is so high that the voltage distribution over the resistors 34 and 23 is permissible and is without appreciable negative influence. If however the output voltage of the control voltage generator 33 can be made so high that the voltage distribution over the resistors 34 and 23 is permissible, the condenser 22 may be omitted altogether.

What is claimed is:

1. In a circuit for the optional dynamic compression or expansion of an input signal, said circuit including a useful signal path having at least one variable gain amplifier therein for receiving said input signal; an auxiliary branch path having at least one variable gain amplifier and a control signal generator therein, the input of said auxiliary branch path being coupled to said useful signal path; said first and second field effect transistors each having a control electrode coupled to the output of said auxiliary branch path for receiving a direct control voltage, each of said first and second field effect transistors further having a source-sink path coupled to respective amplifiers in said useful signal path and said auxiliary branch path for controlling the gains thereof; wherein the improvement comprises:

a voltage divider having a voltage tap thereon coupled across the source-sink path of said first field effect transistor; and a separating amplifier coupling the voltage tap of said voltage divider to the control electrodes of said first and second field effect transistors to provide an alternating voltage therefor.

2. A circuit arrangement according to claim 1 wherein the amplification of said separating amplifier is approximately equal to half the value across the source-sink path of said first field effect transistor.

3. A circuit arrangement according to claim 1 which further comprises a separating condenser and a separating resistor connected in series with the output of said separating amplifier.

4. A circuit arrangement according to claim 1 wherein a separating resistor is coupled in series with the output of said control signal generator.

5. A circuit arrangement according to claim 1 wherein first and second protective resistors are connected in series with the control electrodes of said first and second field effect transistors respectively.

* * * * *